(12) United States Patent
Kawai

(10) Patent No.: US 6,642,617 B2
(45) Date of Patent: Nov. 4, 2003

(54) SEMICONDUCTOR DEVICE

(75) Inventor: Takahisa Kawai, Yamanashi (JP)

(73) Assignee: Fujitsu Quantum Devices Limited, Yamanashi (JP)

( * ) Notice: Subject to any disclaimer, the term of this patent is extended or adjusted under 35 U.S.C. 154(b) by 0 days.

(21) Appl. No.: 10/241,522

(22) Filed: Sep. 12, 2002

(65) Prior Publication Data

US 2003/0052413 A1 Mar. 20, 2003

(30) Foreign Application Priority Data

Sep. 14, 2001 (JP) ........................................ 2001-280516

(51) Int. Cl.[7] ............................................. H01L 23/24
(52) U.S. Cl. .................... 257/724; 257/723; 257/664
(58) Field of Search ................................. 257/723, 724, 257/664, 686, 778, 784, 698, 700

(56) References Cited

U.S. PATENT DOCUMENTS

| | | | |
|---|---|---|---|
| 5,918,112 A | * | 6/1999 | Shah et al. |
| 6,351,194 B2 | * | 2/2002 | Takahashi et al. |
| 6,396,154 B1 | * | 5/2002 | Hikita et al. |
| 6,534,855 B1 | * | 3/2003 | Ahan et al. |

OTHER PUBLICATIONS

Patent Abstracts of Japan, Publication No. 8–274575 dated Oct. 18, 1996 Discussed in the specification.

* cited by examiner

*Primary Examiner*—Sheila V. Clark
(74) *Attorney, Agent, or Firm*—Armstrong, Westerman & Hattori, LLP

(57) ABSTRACT

A semiconductor device includes a SAW device chip. The SAW device chip is provided on a passive element chip in which a passive element circuit including a transmission line is formed on a semi-insulating compound substrate having one surface set to have a ground potential electrode. In the semiconductor device, even when the width of the transmission line is increased, a high characteristic impedance can be maintained by increasing the thickness of the substrate. This can reduce the resistance of the transmission line and can facilitate matching with the SAW device.

8 Claims, 3 Drawing Sheets

SEMICONDUCTOR DEVICE

BACKGROUND OF THE INVENTION

1. Field of the Invention

The present invention relates to semiconductor devices for use in high-power high-frequency circuits provided with surface acoustic wave (SAW) devices, and in particular, to a semiconductor device for use in transmitting/receiving circuits for radio communication using portable units.

2. Description of the Related Art

In portable radio communication terminals, SAW devices such as SAW filters and SAW duplexers are used for the purpose of, for example, separation of a received signal, or suppression of an unnecessary signal. Japanese Unexamined Patent Application Publication No. 8-274575 discloses an attempt to achieve size reduction of a transmitting/receiving semiconductor device by mounting a SAW-device-formed chip on a circuit substrate having a high frequency circuit formed thereon. The circuit substrate used in the semiconductor device disclosed in the above Publication is described below.

FIG. 1 is a sectional view of a circuit substrate of the prior art in which a SAW device chip 3 is provided to a Si substrate 30 having a high frequency circuit formed thereon. Referring to FIG. 1, the circuit substrate has an insulating film 31 formed on the Si substrate 30, a passive element pattern 33 and a capacitor 35 which are formed on the insulating film 31. The passive element pattern 33 includes passive elements such as a thin film resistor, a thin film capacitor, and a thin film inductor, and are electrically connected to pads 32 formed on the insulating film 31.

The SAW device chip 3 is bonded to the pads 32 above the passive element pattern 33 so that interdigital transducers constituting a SAW pattern are directed downward, with bumps 34 provided therebetween.

In the circuit substrate, the SAW device chip 3, on which a SAW device is formed, is directly mounted on the Si substrate 30. Accordingly, it is not necessary to accommodate the SAW device chip 3 in a dedicated housing, so that the size of the transmitting/receiving semiconductor device can be reduced. Also, since the SAW device chip 3 is formed above the passive element pattern 33, which generates a small amount of heat, a change in the characteristics of the SAW device chip 3, which has large dependency on temperature, can be suppressed.

The above-described circuit substrate can be made of one of ceramic material, glass, sapphire, etc., instead of Si. Nevertheless, insulating substrates made of these materials have great differences in physical and chemical properties, for example, specific heat and surface roughness. Accordingly, chemical vapor deposition (CVD) conditions for forming passive elements on such the above insulating substrates are greatly different from CVD conditions for the semiconductor. Also processing conditions such as substrate etching are different from those for the semiconductor. Therefore, when the insulating substrates made of the above materials are used, it is difficult to use the semiconductor process to form passive elements.

Portable communication devices, for example, devices used as mobile communication terminals such as cellular phones, must handle high frequency waves of approximately 800 MHz to 1.9 GHz by using large power. Accordingly, it is required that high density such a large-output high-frequency circuit be integrated at a high density without deteriorating power efficiency.

SUMMARY OF THE INVENTION

It is an object of the present invention to provide a small semiconductor device that efficiently handles a high-power high-frequency signal by achieving size reduction using a SAW-device-formed chip directly provided to a circuit substrate and by realizing a high frequency circuit having superior impedance matching characteristics and low resistance loss.

To this end, according to the present invention, a semiconductor device is provided which includes a passive element chip including a passive element circuit including, as circuit elements, passive elements which are provided on a semi-insulating compound-semiconductor substrate in which one surface thereof is set to have a ground potential and in which the other surface thereof has neither transistor nor diode, and a surface-acoustic-wave-device chip on which a surface acoustic wave device is formed. The surface-acoustic-wave-device chip is provided on the passive element chip so that the surface acoustic wave devices are electrically connected to the passive element circuit. The passive element circuit includes a transmission line which is formed on the semi-insulating compound-semiconductor substrate and which functions in combination with the surface having the ground potential.

Preferably, the semi-insulating compound-semiconductor substrate is one of a GaAs substrate and an InP substrate.

The passive elements may include one of a resistive element, a capacitive element, and an inductive element.

The surface acoustic wave device may be one of a filter and a duplexer.

The passive element chip may be electrically connected to an active element chip including active elements.

The passive element chip and the active element chip may be accommodated in a single housing.

The substrate of the active element chip may be one of a GaAs substrate, an InP substrate, and a Si substrate.

The active elements may include one of a field effect transistor, a high-electron-mobility transistor, a Si bipolar transistor, a hetero junction bipolar transistor.

According to the present invention in which a transmission line provided on a substrate made of semi-insulating compound semiconductor, the wide transmission line having a high characteristic impedance is formed, and by using a semiconductor process, a passive element circuit that uses the transmission line to establish good impedance matching with a SAW device can be produced. Therefore, a semiconductor device that transmits or receives a high-power high-frequency signal can be realized and greatly contribute to improvements in the performance of radio communication devices.

DESCRIPTION OF THE PREFERRED EMBODIMENTS

Figure 1:
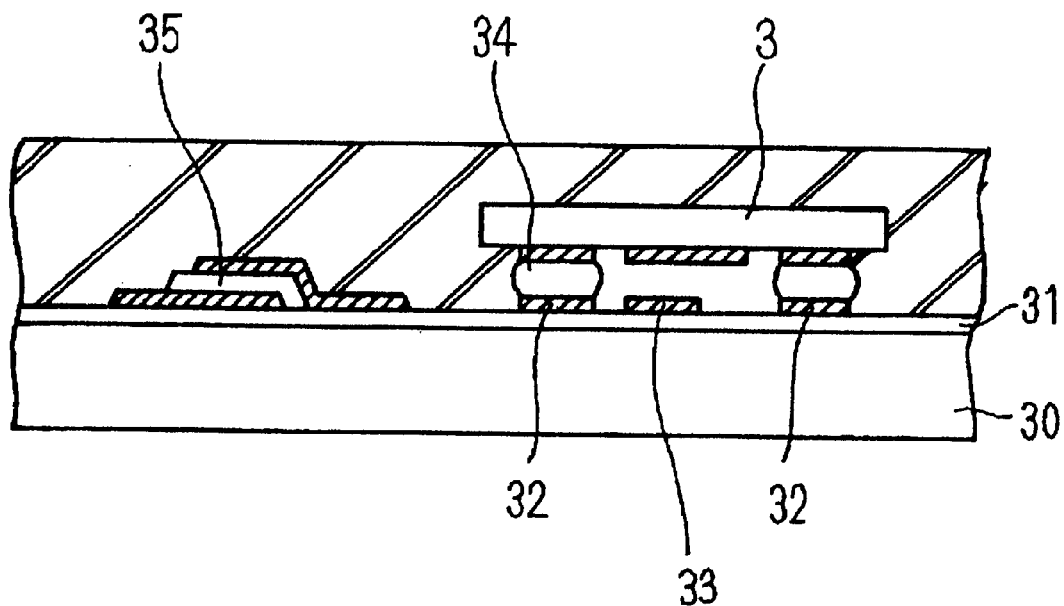
FIG. 1 is a sectional view showing the prior art.
Figure 2:
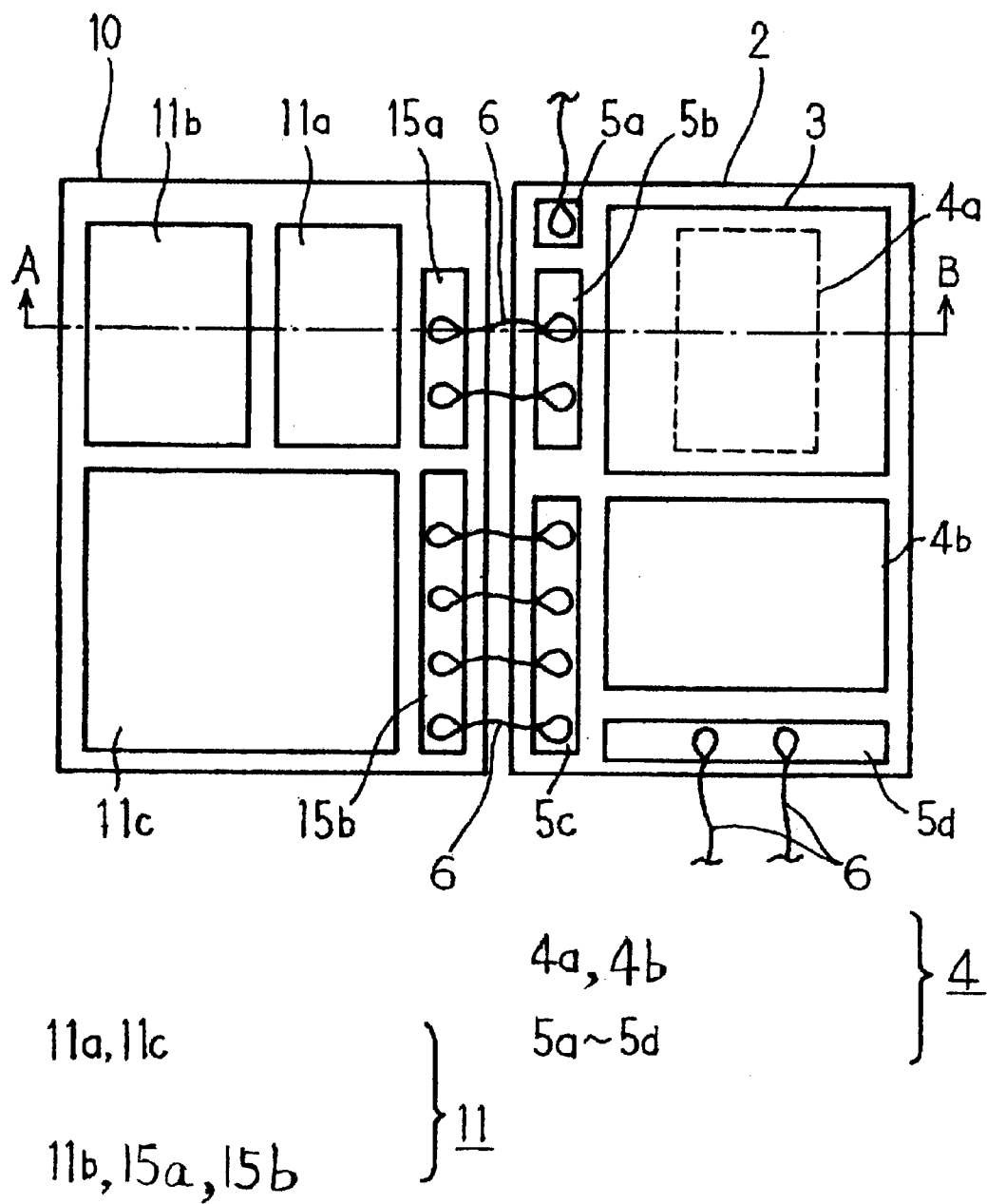
FIG. 2 is a plan view showing an embodiment of the present invention.
Figure 3:
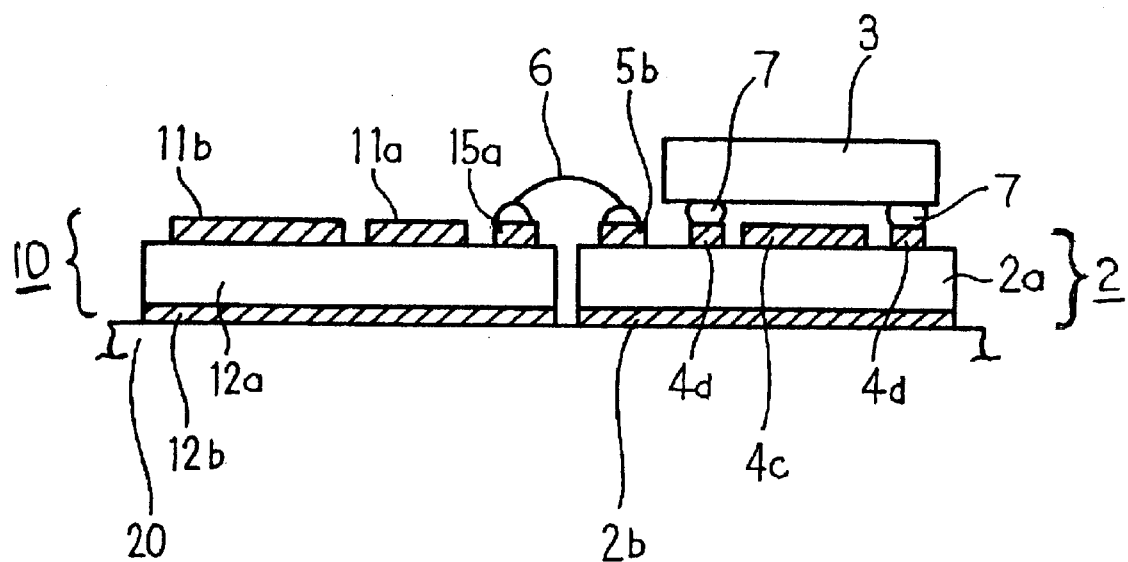
FIG. 3 is a sectional view taken on the line III–III' shown in FIG. 2.

FIG. 2 is a plan view of a semiconductor device according to an embodiment of the present invention. The semiconductor device has a SAW device provided above a passive element chip. FIG. 3 is a sectional view taken on the line A–B shown in FIG. 2.

Referring to FIGS. 2 and 3, a SAW device 3 is provided on the upper surface of a passive element chip 2. The passive element chip 2 includes a passive element circuit 4 including a semi-insulating compound-semiconductor substrate 2a and a transmission line 4c provided on the upper surface of the substrate 2a. The lower (back) surface of the substrate 2a is provided with, for example, a ground potential electrode 2b so as to be conductive and to be retained at a ground potential. The transmission line 4c forms a line (e.g., a microstrip line) constituted by a distributed constant circuit in which the ground potential electrode 2b on the lower surface of the substrate 2a is used as the potential of the other electrode. By using the transmission line 4c in this way, in high frequency bands of 800 MHz to 1.9 GHz, superior impedance matching characteristics can be realized.

In this embodiment, the substrate 2a provided with the passive element circuit 4 is made of a semi-insulating compound semiconductor, for example, semi-insulating InP or GaAs. Accordingly, the distributed constant circuit is constituted by the transmission line 4c and the ground potential electrode 2b respectively provided on the upper and lower surfaces of the substrate 2a, with the substrate 2a provided therebetween. The characteristic impedance of the transmission line 4c is proportional to the distance between the transmission line 4c and the ground potential electrode 2b and is inversely proportional to the width of the transmission line 4c. The substrate 2a can easily be processed to be thick, as required. This makes it possible to raise and easily adjust the characteristic impedance of the transmission line 4c to a desired value by increasing the thickness of the substrate 2a, even if the transmission line 4c is designed to be wide. In other words, the width of the transmission line 4c can be increased while avoiding a decrease in the characteristic impedance. As described above, the characteristic impedance can be adjusted to the desired value with precision, even if the width of the transmission line 4 is large. Thus, a high frequency circuit can be realized which has a large line width capable of handling large power and superior impedance matching characteristics.

In addition, because a compound-semiconductor substrate is used as the substrate 2a provided with the passive element circuit 4, the passive element circuit 4 can be formed under conditions similar to those for the production process (semiconductor process) of an ordinary semiconductor device. For example, a thin film of the passive element circuit 4 can be formed by using CVD or an etching process having conditions identical to those in the case of forming a transistor circuit on a GaAs substrate. Also, unlike a substrate made of insulating material such as ceramic material, the semiconductor substrate can easily be processed, such as etching, so that it is easy to form a viahole penetrating the substrate 2a. This facilitates disposition of viaholes and increases the degree of freedom in circuit design. Moreover, since the semiconductor substrate has a high dielectric constant, a transmission line formed thereon has a large inductance per unit length. Thus, the transmission line can be shortened.

Although the semiconductor process can be used for a Si substrate, the Si substrate cannot be used as the substrate 2a for the passive element circuit 4. This is because the Si substrate has low insulation and cannot have a transmission line costituting a distributed constant circuit which is constructed of the transmission line on one surface of the Si substrate and a ground potential on another surface. Accordingly, passive elements must be provided on the Si substrate, with an insulating film provided therebetween, as in the above-described prior art on its upper and lower surfaces. In this case, when the transmission line is applied as a passive element, the distance between the Si substrate having the ground potential and the transmission line is limited to an extremely small insulating film thickness. As a result, the characteristic impedance of the transmission line is small, so that it is difficult to establish impedance matching. To avoid this problem, if the transmission line is narrowed to increase the characteristic impedance, resistance loss increases, so that it is impossible to handle a large power signal. In the present invention, the loss due to mismatching loss of impedance and the resistance loss in the transmission line are reduced. Thus, a passive element circuit that can handle a large-power high-frequency signal at a high efficiency is realized.

The passive element circuit 4 in the present invention includes passive elements such as resistive elements, capacitive elements, and inductive elements, and does not include active elements such as transistors and diodes. Thin film resistors may be used as the resistive elements, metal-insulator-metal (MIM) capacitors may be used as the capacitive elements, and spiral or meander inductors may be used as the inductive elements. The passive element circuit 4 may be formed of only the transmission line 4c. The passive element circuit 4 may also include a penetrating viahole that connects patterns formed on the upper and lower surfaces of the substrate 2a. One example of the viahole is one that establishes the connection between the upper line on the substrate 2a connected to the ground potential and the ground potential electrode 2b on the lower surface of the substrate 2a. For example, a filter or a duplexer is used as the SAW device.

In addition to the above-described structure in the present invention, the active element chip 10 can be connected to the passive element chip 2, as shown in FIGS. 2 and 3. This connection is performed by, for example, wire bonding in order to establish thermal insulation between the chips 10 and 2. The chip 10 includes greatly exothermic active elements, such as an FET, a HEMT, a Si-bipolar transistor, and a hetero junction bipolar transistor (HBT), on a semiconductor substrate 12a such as a GaAs substrate, an InP substrate, a GaN substrate or a Si substrate. The chip 10 may also include a circuit formed of passive elements such as a matching circuit 11b. By separating the active element chip 10 including the greatly exothermic active elements from the passive element chip 2 provided with the SAW device chip 3, thermal influence on the SAW device, which is sensitive to a temperature change, can be reduced. Also, the active element chip 10 can be accommodated in a single housing, with the passive element chip 2.

Figure 4:
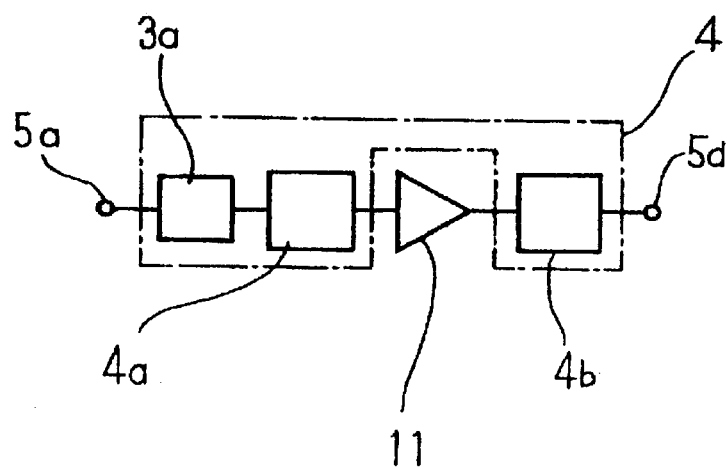
FIG. 4 is a circuit diagram showing an embodiment of the present invention.

Next, a second embodiment of the present invention is described below in which the present invention is applied to a semiconductor device for amplifying high frequency power of a portable terminal for radio communication in a range of 800 MHz to 1.9 GHz. FIG. 4 is a circuit diagram of this embodiment, and shows a power amplifying circuit. Referring to FIG. 4, a high frequency input signal supplied to an input terminal 5a is output to a semiconductor amplifying circuit 11 through a SAW filter 3a and a matching circuit 4a. The output of the amplifying circuit 11 is output to an output terminal 5d through an impedance matching circuit 4b for matching with the load. The matching circuits 4a and 4b are in a passive element circuit 4 including a transmission line as a circuit element.

As shown in FIGS. 2 and 3, in the semiconductor device according to the second embodiment, the passive element chip 2 and the active element chip 10 are accommodated in a form mounted on a module base 20.

In the passive element circuit 2, GaAs is used as the material for the substrate 2a. A ground potential electrode 2b is formed on the lower surface of the substrate 2a and is set to retain the ground potential. On the upper surface of the substrate 2a, impedance matching circuits 4a and 4b, and terminals 5a to 5d as patterns are provided. A terminal 5a is an input signal terminal for a signal from the outside of the semiconductor device and is connected to a pad 4d in the matching circuit 4a. In the matching circuit 4a, another pad 4d is provided, and the SAW device formed on the SAW device chip 3 is connected to the matching circuit 4a through bumps 7 formed on the pads 4d. A terminal 5b and 5c are connection terminals for connecting to the active element chip 10, and both are connected by terminals 15a and 15b provided on the active element chip 10 and wires 6. A terminal 5d is a connection terminal for connecting to the load.

Each of the matching circuits 4a and 4b has a distributed constant circuit which is formed between it and the ground potential electrode 2b and which uses a transmission line 4c. The matching circuit 4a is provided in order to convert the output impedance of the SAW device chip 3 into a lower input impedance of the amplifying circuit 11. The transmission line 4c included in the matching circuit 4a is designed, for example, as a pattern having a width of 100 micrometers. At the same time, the thickness of the GaAs substrate 2a is set to 100 micrometers so that the characteristic impedance is matched with the output impedance of the SAW device. Also, the output impedance of the amplifying circuit 11 is matched with a higher impedance value, for example, a load impedance of approximately 50 ohms by the matching circuit 4b. Accordingly, by forming the transmission line 4c with a large width pattern of, for example, 100 micrometers, and reducing the characteristic impedance and the resistance of the transmission line 4c, a loss generated in the case of handling large power is reduced.

As described above, the characteristic impedance of the transmission line 4c having a wide width can be increased also by thickening the substrate 2a, whereby a matching circuit having less resistance loss can be realized without deteriorating the matching characteristics.

In the active element chip 10, a semiconductor substrate on which various transistors are formed, for example, a Si substrate, a GaAs substrate, an InP substrate, or a GaN substrate is used as the substrate 12a, and the amplifying circuit 11 is formed on the substrate 12a. The amplifying circuit 11 is constituted by two transistor amplifying states 11a and 11c, and one matching circuit 11b. The transistor amplifying stage 11a is a pre-amplification circuit, and amplifies the output of the matching circuit 4a on the passive element chip 2 which is input to the terminal 15a and outputs the amplified output to the transistor amplifying stage 11c through the matching circuit 11b.

The transistor amplifying stage 11c is a power amplifying circuit and its output signal is supplied through the terminal 15b to the matching circuit 4b on the passive element chip 2. Also, as described above, the signal is output from the matching circuit 4b to a load such as an antenna through the terminal 5d. By providing the matching circuit 4b on the passive element chip 2, the transmission line 4c, which has a large width, can be used without deteriorating the characteristic impedance. Accordingly, a high-power high-frequency signal can be output even to a load having a relatively high impedance.

The invention may be embodied in other specific forms without departing from the sprit or essential characteristics thereof. The present embodiments are therefore to considered in all respects as illustrative and not restrictive the scope of the invention being indicated by the appended claims rather than by the foregoing description and all changes which come within the meaning and range of equivalency of the claims are therefore intended to be embraced therein.

What is claimed is:

1. A semiconductor device comprising:

a passive element chip including a passive element circuit including passive elements as circuit elements, said passive element circuit being provided on a semi-insulating compound-semiconductor substrate in which one surface thereof is set to have a ground potential and in which the other surface thereof has neither transistor nor diode; and a surface-acoustic-wave-device chip on which a surface acoustic wave device is formed;

wherein:
   said surface-acoustic-wave-device chip is provided on said passive element chip so that said surface acoustic wave devices are electrically connected to said passive element circuit; and
   said passive element circuit includes a transmission line which is formed on said semi-insulating compound-semiconductor substrate and which functions in combination with the surface having the ground potential.

2. A semiconductor device according to claim 1, wherein said semi-insulating compound-semiconductor substrate is one of a GaAs substrate and an InP substrate.

3. A semiconductor device according to claim 1, wherein said passive elements include one of a resistive element, a capacitive element, and an inductive element.

4. A semiconductor device according to claim 1, wherein said surface acoustic wave device is one of a filter and a duplexer.

5. A semiconductor device according to claim 1, wherein said passive element chip is electrically connected to an active element chip including active elements.

6. A semiconductor device according to claim 5, wherein said passive element chip and said active element chip are accommodated in a single housing.

7. A semiconductor device according to claim 5, wherein the substrate of said active element chip is one of a GaAs substrate, an InP substrate, and a Si substrate.

8. A semiconductor device according to claim 5, wherein said active elements include one of a field effect transistor, a high-electron-mobility transistor, a Si bipolar transistor, and a hetero junction bipolar transistor.

* * * * *